United States Patent [19]

Srikrishnan et al.

[11] Patent Number: 5,372,652
[45] Date of Patent: Dec. 13, 1994

[54] AEROSOL CLEANING METHOD

[75] Inventors: Kris V. Srikrishnan, Wappingers Falls; Jin J. Wu, Ossining, both of N.Y.

[73] Assignee: International Business Machines Corporation, Armonk, N.Y.

[21] Appl. No.: 76,064

[22] Filed: Jun. 14, 1993

[51] Int. Cl.$^5$ ............................................. B08B 5/00
[52] U.S. Cl. ................................... 134/7; 134/21; 134/33; 134/902
[58] Field of Search ............. 134/2, 7, 19, 21, 33, 134/902; 148/DIG. 17; 437/231

[56] References Cited

U.S. PATENT DOCUMENTS

| | | | |
|---|---|---|---|
| 4,617,064 | 10/1986 | Moore | 134/7 |
| 4,747,421 | 5/1988 | Hayashi | 134/201 |
| 4,974,375 | 12/1990 | Tada et al. | 51/413 |
| 5,035,750 | 7/1991 | Tada et al. | 134/7 |
| 5,062,898 | 11/1991 | McDermott et al. | 134/7 |
| 5,147,466 | 9/1992 | Ohmori et al. | 134/7 |
| 5,232,512 | 9/1993 | Swain | 134/7 |

OTHER PUBLICATIONS

"Adhesion and Removal of Fine Particles on Surfaces", M. B. Ranade, Research Triangle Institute, Aerosol Science and Technology 7:161–176 (1987).

*Primary Examiner*—Gary P. Straub
*Assistant Examiner*—Thomas G. Dunn, Jr.
*Attorney, Agent, or Firm*—Richard Lau

[57] ABSTRACT

An aerosol cleaning apparatus for cleaning a substrate includes an aerosol producing means having a nozzle head. The nozzle head is positioned at a selected proximity and orientation to the substrate which is held by a rotatable holder. The aerosol spray dislodges particles from the substrate and the rotation of the substrate further assists in the removal of the loosened particles. A method of aerosol cleaning includes rotating a substrate at a preselected speed and spraying an aerosol jet in conjunction with the rotation to help in the removal of particles from the substrate.

11 Claims, 5 Drawing Sheets

AEROSOL CLEANING METHOD

RELATED U.S. PATENT APPLICATIONS

This patent application is related to the following commonly assigned, simultaneously filed, patent applications:
U.S. Ser. No. 08/076,051, pending
U.S. Ser. No. 08/076,053, pending
U.S. Ser. No. 08/076,065, pending
U.S. Ser. No. 08/076,052, pending

TECHNICAL FIELD

The present invention is in the field of cleaning of substrates and in particular in the area of aerosol jet cleaning usable in the manufacture of microelectronic components and assemblies.

BACKGROUND OF THE INVENTION

Removal of unwanted foreign materials, process residues, particles, and the like (hereinafter be referred to as contaminant particles or CPs) from the surface of substrates is extremely important for yield and reliability of components in the manufacture of microelectronic products. The term substrate as used herein includes semiconductor wafers, ceramic substrates, printed circuit boards, display panels, displays, disks and other assemblies. Contaminant particles in microelectronics manufacturing has been recognized as originating from ambient including tools, operators and processes which are used in the manufacturing process. In spite of the use of manufacturing rooms equipped with filters (HEPA filters) and blowers to remove airborne particles, use of clean room garments and processes using clean chemicals and equipment designed for low particulate generation, it has heretofore not been possible to eliminate the build up of a certain amount of CPs on substrates during processing, handling and storage. It is therefore a general practice to clean the substrates at certain process intervals to reduce the amount of CPs. Wet cleaning is most widely used, and employs de-ionized water or an alcohol (IPA- iso propyl alcohol) for rinsing/spraying the substrates multiple times to dislodge (overcome adhesion) the particles. A first step in the removal of CPs is to overcome their adhesion to the surface of a substrate.

The adhesion of CPs to the substrate can vary depending on the CP size and the nature of the adhesion forces involved, i.e. whether the force is chemical or physical in origin (M. B. Ranade, in Aerosol Science and Technology, 7, (1987) p161-176). Chemical forces involve interaction /exchange of valence or core electrons between the CP and the substrate. Physical adhesion forces, most common in the adhesion of CPs to substrates in microelectronics, are usually of either van der Wall type exchange or electrostatic forces. These forces can be substantial, and their strength can be several times that of gravitational forces. When the adhesion forces are predominantly electrostatic in nature, selected chemical solutions are often used to neutralize surface charges and thus diminish the electrostatic adhesion. Chemically bound CPs have higher adhesion energies, comparable to binding energies of solids. They are difficult to dislodge by most cleaning techniques and may need to be sputtered away or dissolved by a solvent. The physically bound CPs, in general, can be dislodged by momentum transfer from impinging gases, fluids or solids, a concept used in spray, ultrasonic and aerosol cleaning. Of the processes utilizing momentum transfer, aerosol cleaning has been found most effective in the removal of CPs. This has been described in U.S. Pat. No. 5,062,898. The aerosol used is predominantly solid particles mixed with some gas or liquid. A highly pressurized, precooled gas/liquid is allowed to expand through an orifice, further cooling the gas/liquid due to Joule-Thompson effect, which results in the formation of condensed solid particles. The mixture of solid and gas/liquid particles in the jet is used to blast the susbtrate at high velocities.

Removal of smaller particles is usually more difficult because the adhesion force decreases only linearly with the dimension of the particle, whereas the force that can be applied to overcome adhesion decreases with the area (square) or volume (cube) of the particle. A commonly occurring applied force is gravity, which varies with the volume of the particle. Therefore, applied forces decrease more rapidly with particle size compared to adhesion forces, thereby making the task of removing particles very difficult. Further, the formation of a boundary layer during blasting/cleaning operation, makes coupling of the applied force to the particle less effective. When a substrate is blasted by a medium containing a fluid or in the presence of a fluid forming ambient, a boundary layer is formed on the substrate surface. Usually the boundary layer is made of the impinging gas/liquid or gaseous/liquid layer present on the surface of the substrate. When the CP size is of the order of the thickness of the boundary layer, as the case for sub-micron particles, the boundary layer effectively shields the sub-micron particles from the impact of the high pressure spray of the gas or liquid. However, in aerosol cleaning, the solid/hard particles (frozen particles) in the aerosol, are able to penetrate through the surface boundary layer of the substrate, and impinge on the CP. The dynamic impact due to the impinging of the particles can exert a very substantial force overcoming the adhesion of the CP. This force is the first order time derivative of the impact energy. The solid particles in the high pressure aerosol, are propelled with speed near the velocity of sound and momentum transfer between the aerosol particles and FM is completed within a small fraction of a second, thereby impressing a substantial momentary force on the CP to overcome its adhesion.

Some aspects of the use of aerosol cleaning are described in the following US Patents. The features described generally cover composition, apparatus and the cleaning application.

U.S. Pat. No. 4,617,064 describes a particle-blast cleaning apparatus, wherein $CO_2$ pellets are propelled by high pressure $CO_2$ carrier gas and a nozzle is manually directed over the cleaning objects.

U.S. Pat. No. 4,747,421 describes an apparatus for removing photo-resist film from a substrate employing fine $CO_2$ particles. The substrate is affixed to a slidable rod, and moved with respect to the stationary nozzle by a sliding and turning motion. This patent also notes that a 45 degree jet to substrate orientation was much more effective than a 90 degree orientation.

U.S. Pat. No. 4,974,375 describes an apparatus for cleaning of substrates using a jet of ice particles. The substrate is held at a near vertical angle by a supporting table, which is rotated by a motor so that the ice particles hit uniformly over the whole surface of the solid, and the solid surface can be cleaned uniformly.

U.S. Pat. No. 5,035,750 describes the cleaning of semiconductor wafers by blasting the surface with frozen ice particles propelled by a pressurized nitrogen gas. The wafers are moved by conveyor belt.

U.S. Pat. No. 5,062,898 describes the use of an argon aerosol jet for cleaning microelectronic parts.

U.S. Pat. No. 5,147,466 describes a method of cleaning a surface by blasting fine frozen particles against the surface, the hardness of the frozen particles being selected by use of different aerosol materials.

U.S. Ser. No. 07/958,417, filed Oct. 9, 1992, allowed Dec. 14, 1992, relates to an apparatus for cleaning with a cryogenic aerosol. The apparatus described contains: nozzle design, a cleaning chamber housing the nozzle, a substrate holder which supports the wafer and moves the wafer with respect to the aerosol spray in a linear and curvilinear manner to spray over all of the substrate surface, and, a carrier gas to help sweep out the dislodged particles from re-landing on a different part of the substrate. Thus, the features described, are focussed toward effective dislodging and removal of CPs from the vicinity of the substrate being cleaned. The carrier gas feature of the apparatus is expensive to design and operate.

It is therefore desirable to overcome some of the deficiencies in the prior art aerosol cleaning apparatus and process. One of the short coming of prior aerosol cleaning apparatus is the inability to remove effectively the loosened particles from the aerosol spray on a substrate, requiring the aerosol spray to overcome the adhesion of CP to substrate, but also impart sufficient momentum so that CP can clear the susbtrate being cleaned. Use of nitrogen carrier gas to carry away the air borne CPs is effective only with very small air borne CPs, and further requires that the particle be ejected off the substrate first. The use of nitrogen at high flow rates can be expensive. Another short coming of prior art aerosol cleaning process is the need to make multiple spray passes of the substrate linearly back and forth in order to sweep the CPs from one end of the substrate to the other. This is time consuming and lowers the productivity of aerosol cleaning. A further general deficiency of prior aerosol apparatus is the need to use part of the aerosol particle momentum to impart a horizontal velocity on the CPs. This means that aerosol bombardment energy can not be optimized for overcoming CP adhesion alone.

OBJECTS OF THE INVENTION

A feature of the invention is to provide a simple but effective apparatus design utilizing aerosol spray for cleaning of substrates.

Another feature of the invention is to provide a method for sweeping the airborne contaminant particles from a substrate efficiently without increasing the complexity of the cleaning apparatus.

A further feature of the invention is to improve the effectiveness of aerosol jets in dislodging the particles on a substrate.

A still further feature of the invention is the provision of an improved apparatus and method compatible with existing manufacturing practice in the micro-electronics industry.

SUMMARY OF THE INVENTION

An aerosol cleaning apparatus for cleaning a substrate includes an aerosol producing means having a nozzle head. The nozzle head is positioned at a selected proximity and orientation to the substrate which is held by a rotatable holder. The aerosol spray dislodges particles from the substrate and the rotation of the substrate further assists in the removal of the loosened particles.

An aerosol cleaning method includes rotating a substrate at a preselected speed and an aerosol jet sprayed in conjunction with the rotation to help in the removal of particles from the substrate.

BRIEF DESCRIPTION OF THE FIGURES

The foregoing and other objects, features and advantages of the invention will be apparent from the following more particular description of the invention illustrated in the accompanying drawings in which.

DESCRIPTION OF THE PREFERRED EMBODIMENTS OF THE INVENTION

Figure 1:
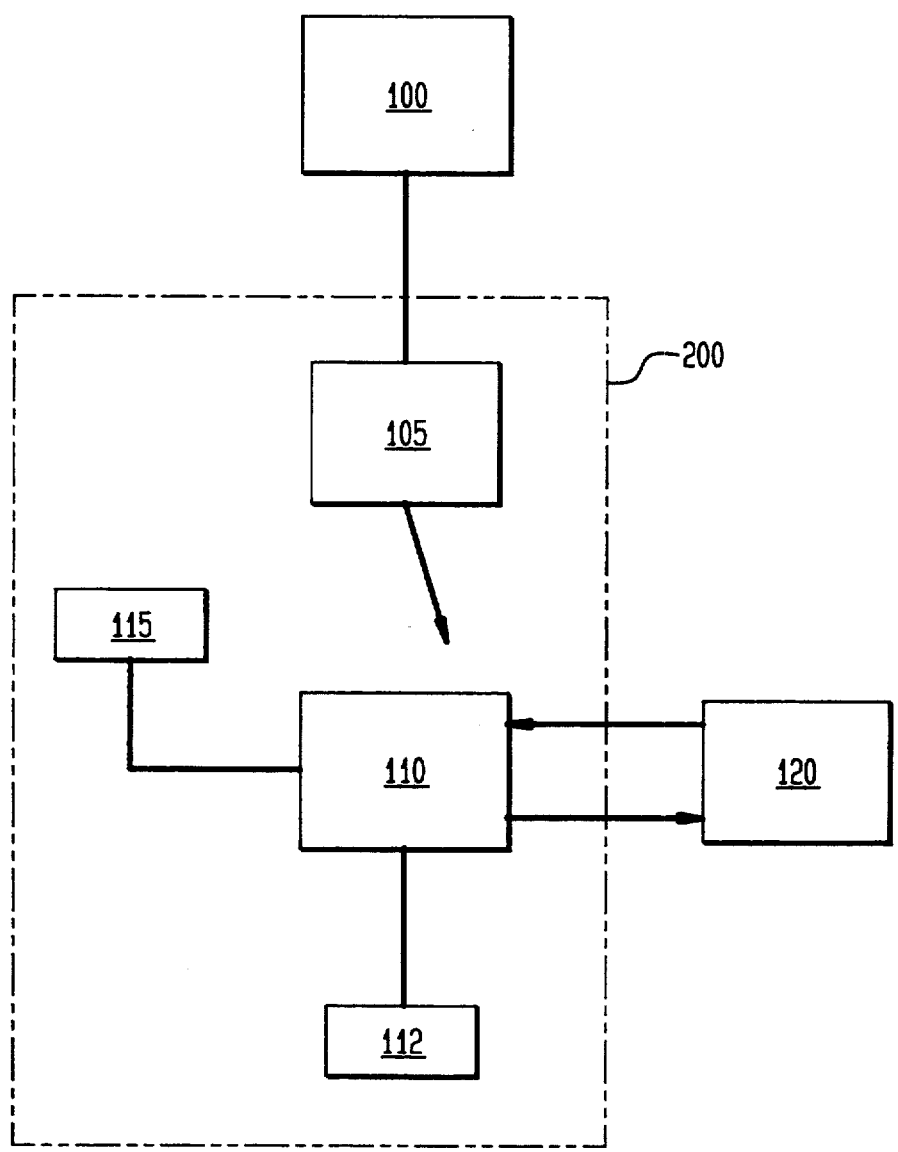
FIG. 1 illustrates in block diagram form a preferred embodiment of aerosol cleaning method and apparatus in accord with the present invention.

FIG. 1 is a diagram generally illustrating an aerosol cleaning apparatus/method of the present invention. Aerosol equipment 100 includes conventional components used for producing aerosol such as, a source of gas and/or liquid, precooling/pressurizing equipment, impurity traps, insulated transfer pipes, etc. A spray nozzle head 105 for producing aerosol is shown separately. The spray nozzle head 105 is integrally connected to the aerosol equipment 100. Precooled gas/liquid at high pressure is expanded through apertures in the spray nozzle head 105 so as to nucleate solid particles from Joule Thompson cooling in the jet spray. The spray is directed onto a substrate being held by a substrate holder 110. Heating means 115, preferably a heat lamp, is electrically interlocked with the substrate holder 110 to turn "ON" or "OFF" at preselected times, and in conjunction with the spray cleaning and substrate rotation operations. The radiation of the lamp can heat an entire wafer or, preferably can be focussed down to a segment of the wafer. The substrate holder 110 can be one of a variety of holders, such as a by one of mechanical clamp, vacuum clamp or an electrostatic chuck.

Figure 2A:
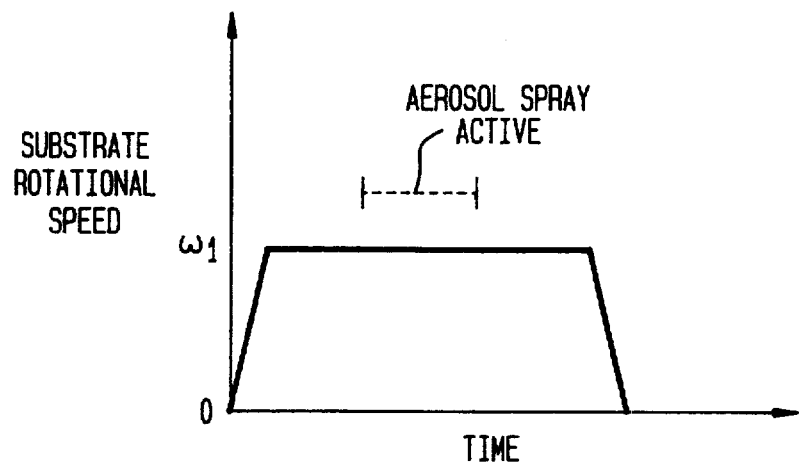
FIGS. 2 A–C show examples of different ways of combining substrate rotation and aerosol spray application.
Figure 2B:
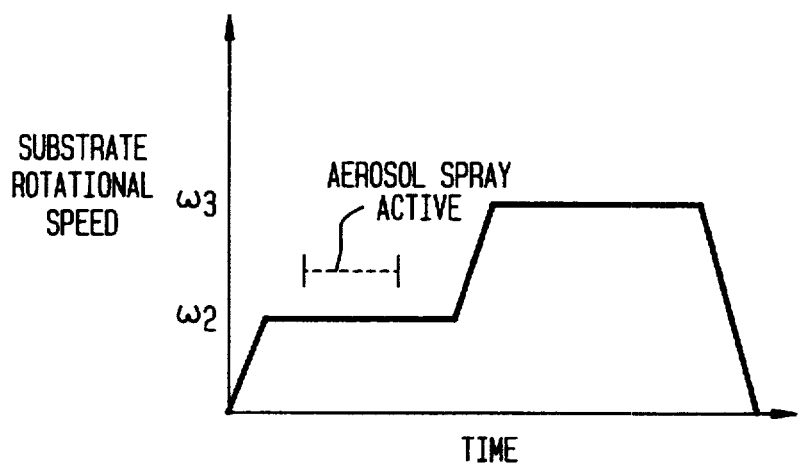
Figure 2C:
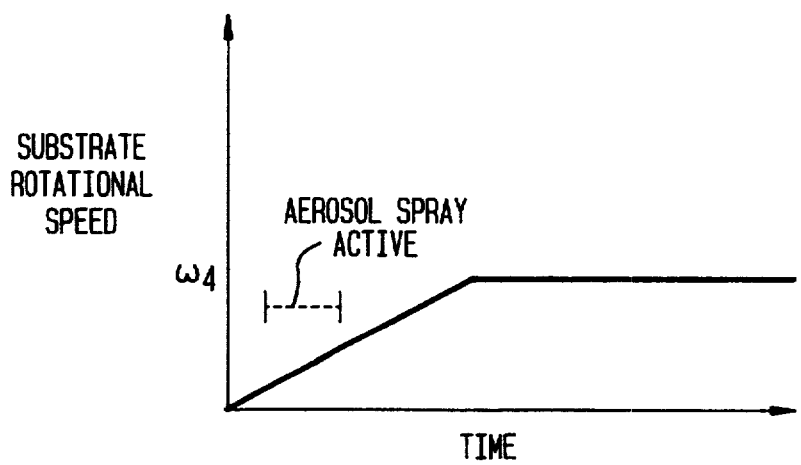

The substrate holder 110 is driven by programmable rotation means 112, for example a programmable motor directly or indirectly using gears and belts, for a preselected speed and time duration. As shown in FIG. 2 A–C, the rotation of the substrate holder and the aerosol spray blasting operation can be programmed so as to be coordinated in a manner which is sequential, or simultaneous relative to each other or combination of sequential and simultaneous rotating and spray blasting can also be implemented. Further, alternate rotation spray combinations can be recognized and practiced by those skilled in the art in accordance with the present invention. FIGS. 2 A-C graphically depicts, a rotation of a substrate, wherein w1, w2, w3 and w4 refers to speed of rotation, against an arbitrary time scale (x-axis). The dotted lines depict when the aerosol spray is applied during substrate rotation. FIG. 2C shows a case of the aerosol spray being activated while the substrate rotation is ramped slowly, followed by high speed rotation of the wafer substrate, without aerosol jet spray, to remove particles loosened by the aerosol spray. FIG. 2b shows the use of a low/high speed rotation cycle, with the aerosol spray being applied onto the substrate only during the lower speed rotation. FIG. 2A shows a simpler case, wherein the substrate is rotated at a fixed speed and the aerosol spray is applied onto the substrate during a part or full rotational cycle.

The speed of rotation is selected so as to apply significant centrifugal force and impart considerable instantaneous in-plane velocity to the CPs on top of the substrate. The lower speed used during blasting can range from almost zero (2 rpm) to 1000 rpm, while the higher spinning speed during the non-blasting operation can be typically from 500 to 8000 rpm. In one of the preferred embodiments, the substrate is ramped to a speed of 3000 rpm, the aerosol spray is turned on for 30 seconds to 2 minutes, and the rotation of the wafer is ramped down to a stop. The aerosol spray time can usually range from 10 seconds to 5 minutes.

A wafer handling robot 120 is preferably interfaced with the substrate holder 110 to place substrates to be cleaned in the holder 110, and for removing the substrates after the aerosol clean operation. In the preferred mode, the wafer holder 110, the aerosol spray nozzle 105, the heating means 115 and the rotation means 112 are located within an enclosure 200, capable of evacuation or purging.

If purging is utilized, non-oxidizing and mostly inert gases such as nitrogen, argon and CO2 are preferably used. In the preferred embodiment, an air exhaust is provided to remove the aerosol spray after impact with the CPs and to remove the dislodged CPs. Further the air exhaust preferably maintains a controlled atmosphere or partial vacuum inside the enclosure 200. If required, a vacuum pump can be used to evacuate and maintain the enclosure 200 at a preferred vacuum of $10^{-4}$ torr to below atmospheric pressure.

The heating means 115 and the rotating means 112 can be located external to the enclosure 200 while providing needed access or coupling. Advantageously such design eliminates the need for a carrier gas and takes advantage of existing techniques for wafer handling and rotation, while achieving a high efficiency cleaning operation. The wafer handling robot 120 can be built into an intermediate chamber (not shown), so as to simplify the substrate transfer process, while maintaining an evacuated condition inside the cleaning chamber.

More specifically, concepts, features and various embodiments of the invention and its embodiments are further discussed hereinafter.

Figure 3:
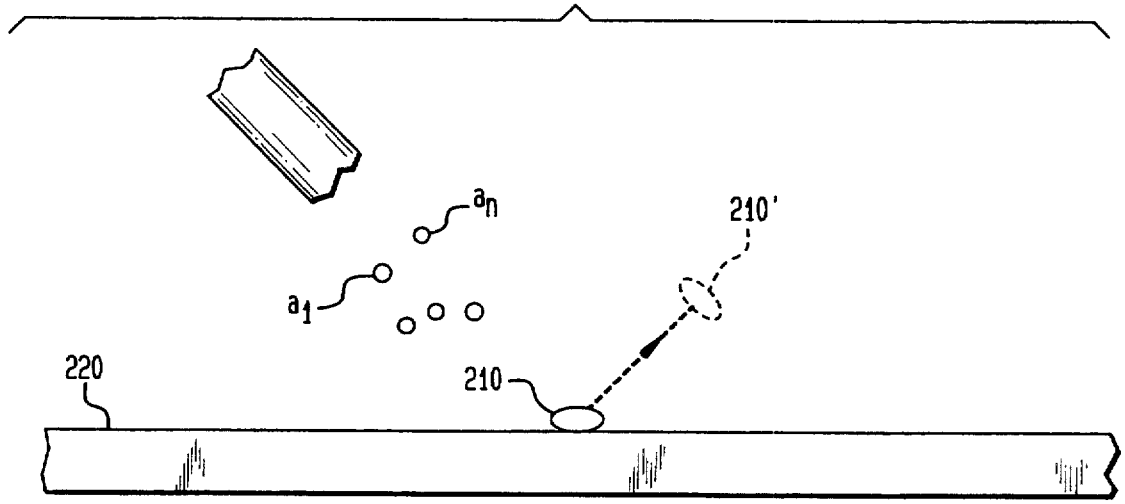
FIG. 3 illustrates in schematic form solid particles from an aerosol impinging on a foreign material on a substrate.

Referring to FIG.3, an aerosol particle stream, having particles $a_1 \ldots a_n$, is shown impinging on a CP 210 adherant on a substrate 220, during a certain time interval. The time interval in which a CP is bombarded by aerosol particles during one rotation of the substrate in accordance with this invention is typically in milliseconds, depending on the width of spray. Some of the kinetic energy of the aerosol spray is transferred to the CP 210 as heat to overcome its adhesion to the substrate 220; some of the energy is spent on heating of the aerosol itself causing the solid to change into a liquid or gas; and some of the energy is transferred to the kinetic energy of the CP.

Another aspect of the energy transfer as a result of the collision of aerosol particles with the CP is the generation of very large instant force, as the time of collison is very small. In some situations this instant large force, rather than the average total energy plays a bigger role in overcoming the adhesion. The energy used up by the aerosol solid particles sometimes cause sublimation from solid to gas, with the resultant high pressure gas expansion which, when occurring in the vicinity of the CP 210, can loosen its adhesion. When the energy transferred to the CP 210 exceeds the amount of energy required to overcome adhesion of the CP 210, the CP 210 is dislodged/ejected with a certain velocity, which depends on its excess energy (which is now its kinetic energy). Some key physical parameters of this momentum transfer, such as the velocity and energy of the aerosol solid particles $a_1 \ldots a_n$ and the energy transfer (coupling) efficiency between the aerosol and the CP, have a range of statistical values. This statistical variability usually results in some of the CPs being dislodged and being ejected from the substrate 220 with varying speeds. Further, the elastically recoiling aerosol particles can transfer additional energy to the ejected CP 210' by secondary collision. For a given momentum/energy transferred to the CP, the ultimate velocity of the dislodged CP 210' depends on its mass.

Figure 4:
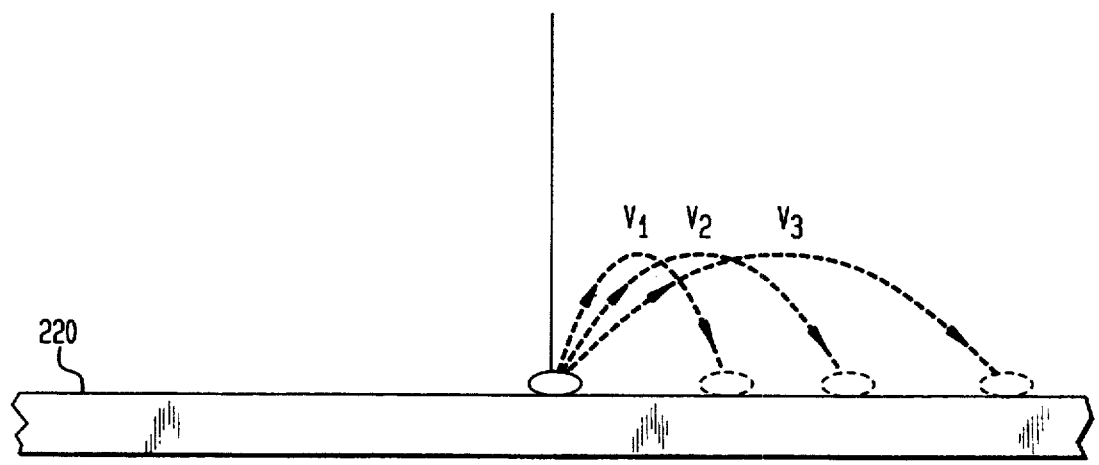
FIG. 4 illustrates in schematic form the trajectory of an ejected particle and the effect of increase in horizontal (in plane) instant velocity on its travel distance (horizontal) over the substrate.

FIG. 4 illustrates graphically some different trajectories an ejected particle can take. The trajectory depends on the angle of ejection, and the relative horizontal and vertical velocities of the ejected particle. In FIG. 4, trajectories $v_1 \ldots v_3$ all represent cases with the same vertical velocity, but with an increase in the horizontal velocity going from $v_1$ to $v_3$, of the ejected particle. It is evident that a greater horizontal velocity parallel to the plane of the substrate 220 can help removal of dislodged CPs from relanding onto a different part of the substrate 220. The preferred orientation of the aerosol jet spray away from normal can be appreciated in light of the foregoing discussion on the need to increase the horizontal velocity of the CPs. It should be appreciated, however, that a balance in vertical and horizontal velocities is required, as the vertical velocity component determines the time the particle is in flight (against gravity) and the horizontal velocity component determines the horizontal distance travelled during time. Sufficient horizontal travel is required for the particle to be cleared off the substrate and avoid re-contamination of the substrate.

In this regard, an important aspect of the present invention is to substantially increase the horizontal velocity of the CP, independent of the aerosol blasting action and angle. The dynamic impact of the aerosol particle will be optimized primarily to dislodge the CP from the substrate. A strong in-plane force and a large in-plane velocity is applied to the CP, in the present invention, by rotating the susbtrate at a certain speed. The centrifugal force due to substrate rotation acts on the CP so as to move it in a tangential direction to the rotating arcurial path away from the center and towards the outer portions of the substrate. Thus, the particle is moved into locations of increasing centrifugal force and higher in-plane velocity until the particle leaves the rotating substrate. The rotational and blasting operations in a complementary manner can be implemented in different ways. For example, the substrate holder can be spun on its axis, and the aerosol bombardment can be turned "ON" during a period of the rotational cycle. In addition, the centrifugal force can cause sliding of the loosened CP to fall off the substrate even when the CP is not ejected, so long as the adhesion has been sufficiently overcome by aerosol blasting.

Figure 5:
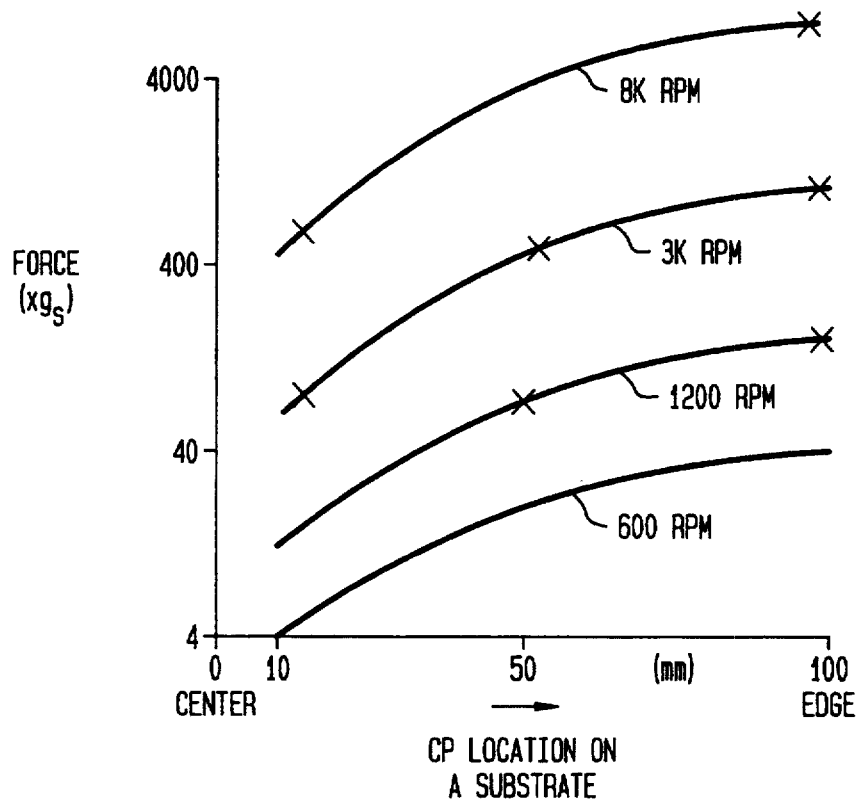
FIG. 5 shows a graph plotting the calculated horizontal force experienced by a particle on a rotating substrate.

FIG. 5, shows calculated centrifugal force experienced by a CP located at a distance from the center of a 200 mm substrate, for the case of rotations ranging from 600 to 8000 rpm. The calculations use the well known centrifugal force equation, $F = m \times w^2 \times r$, where m is the mass of the particle, w is the angular speed in radians/sec., r is the distance of the particle from the center of rotation. The centrifugal force can be conveniently expressed in multiples of gravity force units, as $F = 0.001 \times w^2 \times r \times g$ units, where w is expressed in radians per second, r is in centimeter units, and g is $10^3 \times mass$. This enables visualization of the centrifugal force as a multiple of gravitational pull. According to U.S. Pat. No. 4,974,375, (col 7, lines 48–52), a water jet at 100 kg/cm$_2$ G and an aerosol jet at 2 kg/cm$_2$ G, can be used for cleaning a substrate, whereas ice particle spray are found to be more effective than water spray. The force on a particle from water spray is approximately given by pressure ×impact area, and it scales with the square of the dimension of the particle. Centrifugal force scales with the cube of the particle dimension. FIG. 5 shows that the centrifugal force experienced by CPs are easily comparable to forces from high speed water sprays, but are likely to be less than instantaneous force from aerosol impact. However, unlike the water jet and aerosol spray, wherein the ejected velocity of the CP is determined by total energy and energy transfer, the substrate rotation imparts a substantial velocity on the CP. Therefore, the combination of rotation and aerosol is synergistic in removing particles from substrates. Therefore, spinning the substrate at some minimum speed is a very effective method to remove particles on a substrate whose adhesion has been reduced. The instant horizontal velocity imparted on the CP due to the spinning of the substrate, is a function of its radial location and is given by $w \times r$, where w and r are as defined earlier. Unlike the blasting momentum transfer action where the resultant velocity of the CP depends on the size of the aerosol particle and the size of the CP particle, the spinning caused in-plane velocity on the CP is independent of its size. Further, the centrifugal force experienced by the CP is not impeded by the presence of the boundary layer. An added benefit of the susbtrate rotation is the thinning of the boundary layer. The boundary layer thickness is a tradeoff between the adhesion and viscous forces of the boundary layer and the centrifugal force acting on the fluid forming the boundary layer, further enhancing the effect of aerosol blasting. A thinner boundary layer allows smaller CPs to be more effectively blasted than a thicker layer. The effect of thinning the boundary layer is analogous to obtaining a thinner resist at a higher spin speed.

The suggestion of the preferred blasting orientation in dislodging of the CPs by the impinging aerosol can be viewed similarly to the effect of lever direction in lifting a heavy object. When a substrate is scanned by an aerosol blast linearly, the CPs experience the leverage force from a fixed direction. A rotational motion of the substrate and the CP, such as envisioned in this invention, results in the CP being hit by the aerosol particles from a wider range of directions, than if the substrate were given a linear motion. This multi-directional bombardment can have specific benefits especially in the cleaning of trenches on the surface.

Figure 6A:
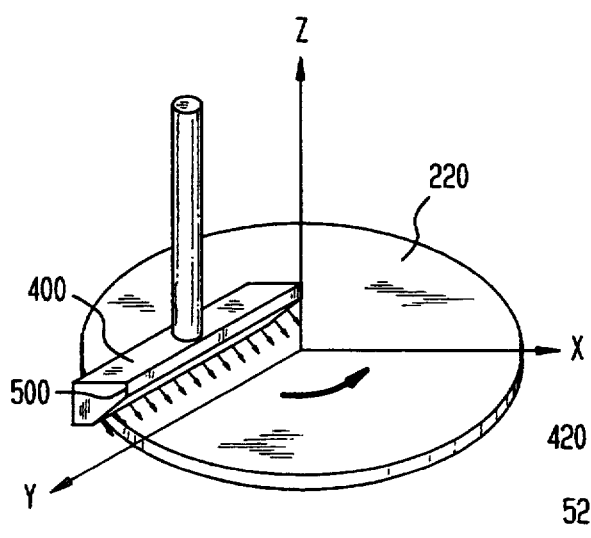
FIGS. 6A–E illustrate in pictorial form, several embodiments of the aerosol spray head arrangement of the present invention for blasting of particles on a rotating substrate.
Figure 6B:
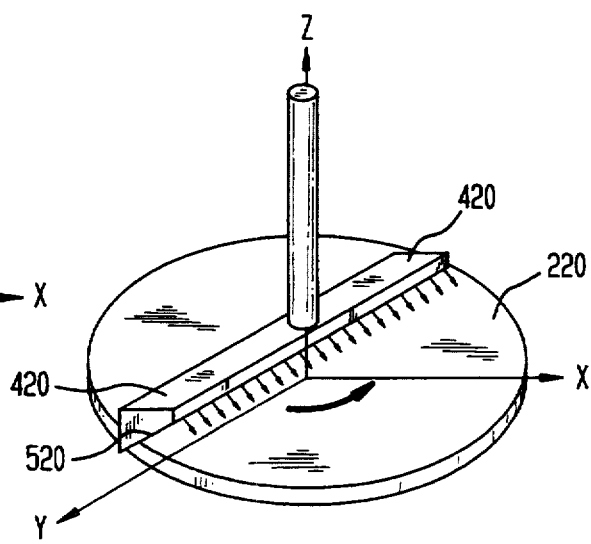
Figure 6C:
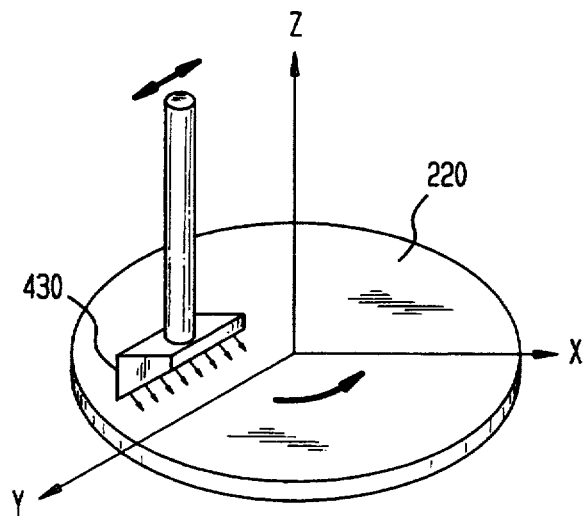
Figure 6D:
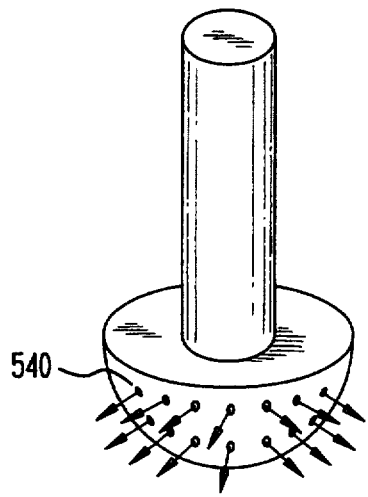
Figure 6E:
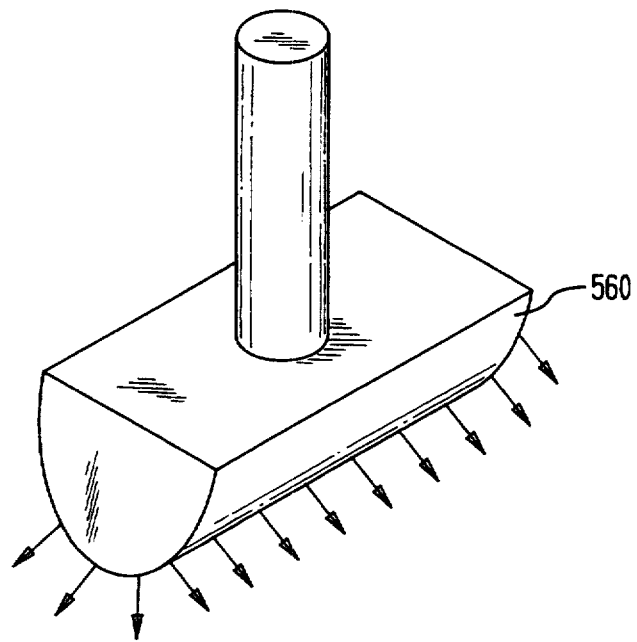

FIGS. 6A–E illustrate examples of spray nozzle arrangements that are preferably used with a rotating substrate. FIG. 6a shows a substrate or wafer 220 rotated about an axis z. An elongated spray nozzle head 400 is shown to be fixed at a specified distance from the substrate 220 and covers the radius of the rotating substrate 220. The nozzle head 400 has been shown with an aerosol spray face plate 500, containing holes fixed at an angle to the vertical axis. Specifically, the aerosol spray face plate shown here is a flat surface at a fixed angle. Alternatively, the orifices can be formed on a curved surface, such as hemispherical or tubular as shown in FIG. 6D and 6E respectively, so as to produce aerosol spray at somewhat diverging angles. In the case of the flat face plate shown in FIGS. 6a, 6b and 6c, the angle can be within 10 to 90 degrees and preferably within 30 to 60 degrees to the plane of the wafer 220. The 90 degree orientation has been made possible since the substrate rotation imparts a horizontal velocity on the CPs. FIG. 6B shows another elongated spray nozzle head 420 which is longer than spray nozzle head 400 in FIG. 6A, and covers the diameter of the rotating substrate 220. As the wafer 220 rotates, the arrangement shown in FIG. 6A, results in aerosol blasting once a turn, and the arrangement in FIG. 6B, results in blasting twice for every rotation of the substrate. Further, in the FIG. 6B arrangement, the CP is blasted (lever force applied) along a leading edge of the CP once and along a trailing edge of the CP once, during each rotation. FIG. 6C shows a point nozzle head with single or multiple orifices confined to a small region for aerosol spray. Point nozzle heads, because of their localized spray pattern, need to be moved to cover the radius of the rotating substrate.

Usually the aerosol exiting surface of the nozzle head is located parallel to the substrate and at a preferred distance of 1 to 20 mm. Different spray nozzle designs can be used as discussed previously herein.

A consequence of the substrate rotation using an uniform aerosol spray (uniformly spaced orifices in the nozzle spray head) is that the rotation provides a greater (longer) aerosol particle bombardment on the CPs at the center of the substrate, and less bombardment on the CPs near the perimeter of the wafer. This is the result of the area of the angular segment being smaller near the center of the substrate, and larger closer to the edge of the substrate, with the impinging time same for all area segments. However, the longer blasting of the CPs near center and less blasting near the perimeter of the substrate is offset by the larger centrifugal force at the perimeter and smaller force at the center from the substrate rotation. Thus, the centrifugal force compensates and compliments the aerosol bombardment force. Further refinements of the spray nozzle can be introduced to fine tune the particle spray if required. For instance, a non-uniform spray pattern can be introduced (for example, by varying the number of orifices) which results in more aerosol spraying near the edge of the substrate and less near the center of the substrate. Even though FIGS. 6A and 6B illustrate a circular semiconductor for the substrate 220, the shape of substrate is not critical. For example, the substrate 220 can be rectangular or any other shape. As long as a firm holding method is employed while rotating the substrate, the shape is non-critical. Accordingly, the holding method can be mechanical clamps, vacuum suction, electrostatic chucks etc. The heating means can be resistive elements incorporated into the wafer chuck or heating lamps located over the substrate to heat the surface by radiation. One of the benefits of heating is to reduce condensation of impurities or water on the surface of the substrate (impurities from aerosol or water from the ambient), which can degrade overall cleaning effectiveness of the aerosol. Another benefit of the hotter surface is to vaporize the solid aerosol particles so that the volatilized aerosol effectively leaves the substrate to be cleaned. As discussed earlier, the aerosol solid to gas change with high pressure expansion and explosion of the gas bubble can improve the CP dislodge effectiveness. In the heat lamp arrangement, the wafer surface can pass under a heat lamp during a part of the rotating cycle. The wafer is rotated between 500 to 8000 rpm and most preferably between 2000 to 4000 rpm. The higher speeds may require expensive apparatus for load balancing. Very low speeds may not provide adequate centrifugal force effectively assist in the removal of CPs. It might also be beneficial to maintain partial vacuum in the chamber to minimize air turbulence created by the rotating substrate which can potentially interfere with the aerosol blasting operation. Partial vacuum can also increase the efficiency of exhausting the CPs.

While the invention has been described in terms of a single preferred embodiment, various alternatives and modifications can be achieved by those skilled in the art without departing from the invention. Accordingly the present invention is intended to embrace all such alternatives which fall within the scope of the appended claims.

What is claimed is:

1. A method of removing unwanted particles on a surface of a substrate used in microelectronics manufacturing, comprising the steps of:

holding the substrate;

rotating the substrate at a speed on the order of 500–800 rpm for applying a centrifugal force which is substantially greater than 1 g, on unwanted particles on said surface;

creating an aerosol spray using Joule-Thompson expansion, said aerosol including solid particles travelling at approximately the speed of sound; and directing said aerosol at the surface of said substrate, for bombarding said unwanted particles with said solid particles, for a selected time duration in coordination with the rotation so that the bombardment of said solid particles and the centrifugal force from the rotating of the substrate causes dislodging and removal of unwanted particles from the surface.

2. The method of claim 1, further comprising the step of maintaining the substrate in a partial vacuum during said step of rotating and during said step of directing the aerosol.

3. The method of claim 1, further comprising the step of heating the substrate in conjunction with said step of rotating and said step of directing the aerosol.

4. The method of claim 1, wherein said step of directing the aerosol and said step of rotating are carried out sequentially.

5. The method of claim 1, wherein said step of directing the aerosol and said step of rotating are carried out simultaneously.

6. The method of claim 1, wherein said step of directing the aerosol is carried out for a duration of more than 10 seconds but less than 5 minutes.

7. The method of claim 1, wherein said step of rotating the substrate is carried out at a speed between 500 rpm to 8000 rpm.

8. The method of claim 7, wherein the speed of rotation is between 2000 to 4000 rpm.

9. The method of claim 1, wherein said step of directing the aerosol at the surface of the substrate is carried out followed by said step of rotating the substrate at a speed between 500 to 8000 rpm.

10. The method of claim 1, wherein said step of directing the aerosol at the surface of the substrate is performed while rotating the substrate at a speed of 500 to 8000 rpm, said step of directing the aerosol being carried out for a partial duration of the rotation.

11. The method of claim 1, wherein said step of directing the aerosol at the surface of the substrate is performed while rotating said substrate at a speed between 500 to 3000 rpm for a selected time duration, followed by rotating the substrate at a speed of 500 to 8000 rpm without directing the aerosol at the surface.

* * * * *

UNITED STATES PATENT AND TRADEMARK OFFICE
CERTIFICATE OF CORRECTION

PATENT NO. : 5,372,652
DATED      : December 13, 1994
INVENTOR(S): K. V. Srikrishnan, J. J. Wu It is certified that error appears in the above-identified patent and that said Letters Patent is hereby corrected as shown below:

In Column 9, line 45, after "500-" please delete "800" and insert therefore -- 8000 --.

Signed and Sealed this

Thirtieth Day of May, 1995

Attest:

BRUCE LEHMAN

Attesting Officer

Commissioner of Patents and Trademarks